United States Patent [19]
Inoi et al.

[11] Patent Number: 6,065,196
[45] Date of Patent: May 23, 2000

[54] METHOD OF MANUFACTURING A LAMINATED PIEZOELECTRIC TRANSFORMER

[75] Inventors: Takayuki Inoi; Susumu Saitou, both of Tokyo, Japan

[73] Assignee: NEC Corporation, Tokyo, Japan

[21] Appl. No.: 09/181,337

[22] Filed: Oct. 28, 1998

Related U.S. Application Data

[62] Division of application No. 08/872,731, Jun. 11, 1997, Pat. No. 5,877,581.

[30] Foreign Application Priority Data

Jun. 11, 1996 [JP] Japan .................................. 8-149295

[51] Int. Cl.$^7$ .................................................. H01L 41/00
[52] U.S. Cl. .......................................... 29/25.35; 310/366
[58] Field of Search ......................... 29/25.35; 310/358, 310/359, 364, 366, 368, 328

[56] References Cited

FOREIGN PATENT DOCUMENTS 3151677  6/1991  Japan .
6224484  12/1994 Japan .

OTHER PUBLICATIONS

K. Kumasaka, et al., "Piezoelectric Transformers Using Multilayer Piezoelectric Vibrators for Lower Voltage Driving," Tokin Technical Review, Nov. 22, 1995, pp. 67–74.

*Primary Examiner*—Carl E. Hall
*Attorney, Agent, or Firm*—Sughrue, Mion, Zinn, Macpeak & Seas, PLLC

[57] ABSTRACT

The piezoelectric layers of a laminated piezoelectric transformer include outermost ceramic layers having first openings defined therein for connection to inner electrodes. The inner electrodes comprise full-face electrodes, each of the inner electrodes having a second opening defined in a corner thereof and filled with an electrically conductive electrode and a third opening defined in another corner thereof and filled with an electrically conductive electrode surrounded by an electrode-free gap. The piezoelectric layers are stacked such that the inner electrodes are alternately electrically interconnected through the-second and third openings which are alternately superposed one on another. The electric generator comprises piezoelectric layers and web-shaped inner electrodes. Each of the web-shaped inner electrodes has a fourth opening defined in at least one end thereof and filled with an electrically conductive electrode.

2 Claims, 11 Drawing Sheets

METHOD OF MANUFACTURING A LAMINATED PIEZOELECTRIC TRANSFORMER

This is a divisional of Application No. 08/872,731 filed Jun. 11, 1997, the disclosure of which is incorporated herein by reference now U.S. Pat. No. 5,877,581.

BACKGROUND OF THE INVENTION

1. Field of the Invention

The present invention relates to a piezoelectric transformer for use in any of various power supply circuits for generating high voltages and a method of manufacturing such a piezoelectric transformer, and more particularly to a laminated piezoelectric transformer comprising an elongate piezoelectric transformer body including a pair of drive regions disposed at respective opposite ends thereof and each comprising a plurality of longitudinally polarized piezoelectric layers and inner electrodes which are alternately superposed, and a longitudinally polarized electric generator disposed longitudinally centrally between the drive regions, and a method of manufacturing such a laminated piezoelectric transformer.

2. Description of the Related Art

Heretofore, it has been customary to use coiled electromagnetic transformers for generating high voltages in high-voltage power supplies for electron beam deflection units in television sets, chargers in copying machines, and other devices which need high voltages. The coiled electromagnetic transformers are of such a structure that a conductive wire is wound around a magnetic core. To achieve a high transformation ratio, it is necessary to increase the number of turns of the wire. Accordingly, it has been difficult to manufacture small-size electromagnetic transformers with high transformation ratios.

There has been proposed a piezoelectric transformer which operates on the principles of the piezoelectric effect. The proposed piezoelectric transformer is called a third-order-Rosen type piezoelectric transformer.

The boosting ratio of the piezoelectric transformer depends on the thickness of a drive region between electrodes and the length of an electric generator. In order to increase the boosting ratio, it is necessary to reduce the thickness of the drive region and increase the length of the electric generator.

Since the conventional piezoelectric transformer has a single piezoelectric layer, there is a certain limitation on efforts to reduce the thickness of the drive region between the electrodes and also on efforts to increase the length of the electric generator in view of demands for reducing the size of the piezoelectric transformer. Practically, it has been impossible to reduce the thickness of the drive region less than 0.5 mm. Another problem encountered when the thickness of the drive region is reduced is that the transformation efficiency of the piezoelectric transformer is lowered as the thickness of the drive region is reduced.

Japanese laid-open patent publication No. 224484/94 discloses a laminated piezoelectric transformer designed to eliminate the above problems. The disclosed laminated piezoelectric transformer is shown in FIG. 1 of the accompanying drawings.

As shown in FIG. 1, the disclosed laminated piezoelectric transformer has a pair of low-impedance drive regions 91 each comprising piezoelectric layers 911 and inner electrodes 912, 913 which are alternately super-posed, with outer electrodes 914, 915 disposed on respective upper and lower surfaces of each of the low-impedance drive regions 91. The outer electrodes 915 are mounted on the lower surface remotely from the outer electrodes 914 and omitted from illustration. The inner electrodes 912, 913 which are alternately exposed on opposite sides are electrically connected by outer electrodes 916, 917. The outer electrodes 917 are mounted on the side remotely from the outer electrodes 916 and omitted from illustration in FIG. 1. The outer electrodes 917 are electrically connected to an external terminal 919, and the outer electrodes 916 are electrically connected to an external terminal 920.

The low-impedance drive regions 91 between the outer electrodes are polarized transversely along their thickness. The disclosed laminated piezoelectric transformer also has a pair of high-impedance electric generators 92 with a web electrode 918 disposed therebetween. The web electrode 918 is connected to an external terminal 921. The electric generators 92 are polarized longitudinally along the length of the laminated piezoelectric transformer. When an AC voltage is applied between the external terminals 919, 920 to energize the piezoelectric transformer, a voltage is outputted between the external terminals 919, 921.

The piezoelectric transformer is produced by laminating and sintering green sheets of ceramics as the inner electrodes 912, 913 and then baking the outer electrodes 914, 915 thereon. Consequently, the thickness of the portion of the piezoelectric transformer between the outer electrodes 914, 915 may stably be reduced, and the boosting ratio thereof may be increased. Since the laminated piezoelectric structure may be increased in their overall thickness, the transformation efficiency is not unduly lowered.

Japanese laid-open patent publication No. 151677/95 reveals a laminated piezoelectric actuator wherein inner electrodes are connected through openings. FIGS. 3A through 3C of the accompanying drawings shows the revealed laminated piezoelectric actuator. The laminated piezoelectric actuator, denoted by 1100, is of a cylindrical shape and comprises ceramic piezoelectric layers each having an opening 1101 with an electrode extending to edges thereof and an opening 1102 with an electrode terminating short of edges thereof. The ceramic piezoelectric layers are stacked, and the openings 1101, 1102 are filled with an electrically conductive elastic material 1103 to electrically connect the electrodes. Each of the openings 1101, 1102 has a thickness ranging from 1 mm to 2 mm. To fill the openings 1101, 1102 with the electrically conductive elastic material 1103, the electrically conductive elastic material 1103 is pressed into the openings 1101, 1102 after the piezoelectric layers with the openings 1101, 1102 are stacked and sintered.

The conventional piezoelectric transformers described above suffer the following shortcomings:

(1) With the third-order-Rosen type piezoelectric transformer, if the boosting ratio is to be increased for producing a high output voltage from a low input voltage, then it is necessary to reduce the thickness of the drive region between the electrodes or increase the length of the electric generator. Inasmuch as the piezoelectric transformer employs a single piezoelectric layer, there is a certain limitation on efforts to reduce the thickness of the drive region between the electrodes and also on efforts to increase the length of the electric generator in view of demands for reducing the size of the piezoelectric transformer. Furthermore, as described above, when the thickness of the drive region is reduced, the transformation efficiency of the piezoelectric transformer is lowered as the thickness of the drive region is reduced.

(2) The laminated piezoelectric transformer can have its boosting ratio increased as the thickness of the drive region between the electrodes can be reduced. However, as shown in FIG. 1, the electric connection of the inner electrodes 912, 913 with the outer electrodes 916, 917 on the sides fails to provide a sufficiently high transformation efficiency. Specifically, when the piezoelectric transformer vibrates, as shown in FIGS. 2A and 2B of the accompanying drawings, it is oscillatingly displaced in directions 1003 along the thickness thereof, directions 1001 along the width thereof, and directions 1002 along the length thereof. The outer electrodes 916, 917 on the sides of the piezoelectric transformer as shown in FIGS. 1 and 2a, however, act to impede the displacement in the directions 1001, 1003, reducing the transformation efficiency.

(3) To produce the piezoelectric transformer, green sheets of ceramics are laminated and sintered as the inner electrodes 912, 913, and then the outer electrodes 914, 915 are baked thereon. As a result, the assembly is heated twice, tending to reduce the transformation efficiency of the resultant piezoelectric transformer. Furthermore, because the electrodes are formed twice, the number of fabrication steps for the piezoelectric transformer is relatively large. Since the outer electrodes are formed on the upper and lower surfaces and also on the sides of the piezoelectric transformer, the number of fabrication steps for the outer electrodes is also large.

(4) The openings in the laminated piezoelectric actuator have a relatively large diameter ranging from 1 mm to 2 mm. Therefore, the openings which are filled up with the electrically conductive elastic material are likely to impede vibrations of the piezoelectric actuator, depending on the position of the openings. Specifically, the electrically conductive elastic material that fills the openings serve as a weight load in the directions in which the piezoelectric actuator vibrates, and is liable to impede vibrations of the piezoelectric actuator. Moreover, the electrically conductive elastic material is pressed into the openings after the ceramic piezoelectric layers are stacked. If the ceramic piezoelectric layers are thinned and their number is increased for a higher boosting ratio, then the electrodes may possibly break off when the electrically conductive elastic material is pressed into the openings.

SUMMARY OF THE INVENTION

It is therefore an object of the present invention to provide a laminated piezoelectric transformer which has a sufficiently large transformation efficiency and boosting ratio, and a method of manufacturing such a laminated piezoelectric transformer.

According to the present invention, there is provided a laminated piezoelectric transformer comprising an elongate piezoelectric transformer body including a pair of drive regions disposed at respective opposite ends thereof and each comprising a plurality of longitudinally polarized piezoelectric layers and inner electrodes which are alternately superposed, and a longitudinally polarized electric generator disposed longitudinally centrally between the drive regions, the piezoelectric layers in the drive regions including outermost ceramic layers having first openings defined therein for connection to inner electrodes, the inner electrodes in the drive regions comprising full-face electrodes, each of the inner electrodes in the drive regions having a second opening defined in a corner thereof and filled with an electrically conductive electrode and a third opening defined in another corner thereof and filled with an electrically conductive electrode surrounded by an electrode-free gap, the piezoelectric layers in the drive regions being stacked such that the inner electrodes thereof are alternately electrically interconnected through the second and third openings which are alternately superposed one on another, the electric generator comprising piezoelectric layers and web-shaped inner electrodes, each of the web-shaped inner electrodes having a fourth opening defined in at least one end thereof and filled with an electrically conductive electrode, the piezoelectric layers of the electric generator being stacked such that the inner electrodes thereof are electrically interconnected through the fourth openings which are superposed one on another.

According to the present invention, there is also provided a laminated piezoelectric transformer comprising an elongate piezoelectric transformer body including a pair of drive regions disposed at respective opposite ends thereof and each comprising a plurality of longitudinally polarized piezoelectric layers and inner electrodes which are alternately superposed, and a longitudinally polarized electric generator disposed longitudinally centrally between the drive regions, the piezoelectric layers in the drive regions including outermost ceramic layers having first openings defined therein for connection to inner electrodes, the inner electrodes in the drive regions comprising at least two web-shaped electrodes, each of the web-shaped electrodes having a second opening defined in at least one end thereof and filled with an electrically conductive electrode, the piezoelectric layers in the drive regions being stacked such that the inner electrodes thereof are electrically interconnected through the second openings which are alternately superposed one on another, the electric generator comprising piezoelectric layers and web-shaped inner electrodes, each of the web-shaped inner electrodes having a third opening defined in at least one end thereof and filled with an electrically conductive electrode, the piezoelectric layers of the electric generator being stacked such that the inner electrodes thereof are electrically interconnected through the third openings which are superposed one on another.

Since the inner electrodes are electrically interconnected through the openings defined in the ends thereof and the outermost ceramic layers have openings for connection to the inner electrodes, the laminated piezoelectric transformer has an increased transformation efficiency and boosting ratio. The laminated piezoelectric transformer is highly reliable as it does not suffer cracking even when energized repeatedly.

Each of the first openings defined in the outermost ceramic layers is filled with an electrically conductive electrode.

According to the present invention, there is further provided a method of manufacturing the laminated piezoelectric transformer described above, comprising the steps of defining the openings in the piezoelectric layers at predetermined positions thereon, filling the openings with the electrically conductive electrodes and forming inner electrode patterns on the piezoelectric layers, stacking the piezoelectric layers such that the openings are superposed one on another, and simultaneously sintering the piezoelectric layers, the inner electrode patterns, and the electrically conductive electrodes.

When the laminated piezoelectric transformer is energized, it is oscillatingly displaced on its input side in directions along its width, thickness, and length as indicated by the dotted lines in FIGS. 7A, 7B and 11A, 11B of the accompanying drawings.

Effects which the positions of the electrodes which interconnect the inner electrodes and the oscillating displacement of the laminated piezoelectric transformer have on the characteristics of the laminated piezoelectric transformer will be described below.

In the conventional laminated piezoelectric transformer, as shown in FIGS. 2A and 2B, the external electrodes 916, 917 which electrically interconnect the inner electrodes are disposed at positions where the displacement in the directions 1001, 1003 along the width and thickness of the laminated piezoelectric transformer is maximum. Therefore, the external electrodes 916, 917 tend to impede the displacement of the laminated piezoelectric transformer, resulting in a vibration loss and a reduction in the transformation efficiency.

According to the present invention, the electrodes which electrically interconnect the inner electrodes are not disposed at positions where the displacement in directions 41, 81 along the width, directions 43, 83 along the thickness, and directions 42, 82 along the length of the laminated piezoelectric transformer is maximum, as shown in FIGS. 7A, 7B and 11A, 11B. Therefore, when the laminated piezoelectric transformer is energized, any level to which the electrodes which electrically interconnect the inner electrodes impede the displacement is lower than with the conventional laminated piezoelectric transformer. With the electrodes which electrically interconnect the inner electrodes being thus positioned, any vibration loss is reduced, and the transformation efficiency is increased.

When the conventional laminated piezoelectric transformer is manufactured, the ceramic layers and inner electrodes are stacked and sintered, and thereafter the electrically conductive paste is coated on the upper and lower surfaces and sides of the assembly, producing the outer electrodes. Therefore, the assembly is heated twice. Particularly, a sintering profile for forming the outer electrodes adversely affects the characteristics of the conventional laminated piezoelectric transformer.

According to the present invention, however, the ceramic piezoelectric layers, the inner electrodes, and the electrodes which electrically interconnect the inner electrodes are simultaneously sintered. Consequently, the assembly is heated only once, and any thermal effects on the characteristics of the laminated piezoelectric transformer are minimized.

The above and other objects, features, and advantages of the present invention will become apparent from the following description with references to the accompanying drawings which illustrate examples of the present invention.

DETAILED DESCRIPTION OF THE PREFERRED EMBODIMENTS

Figure 4:
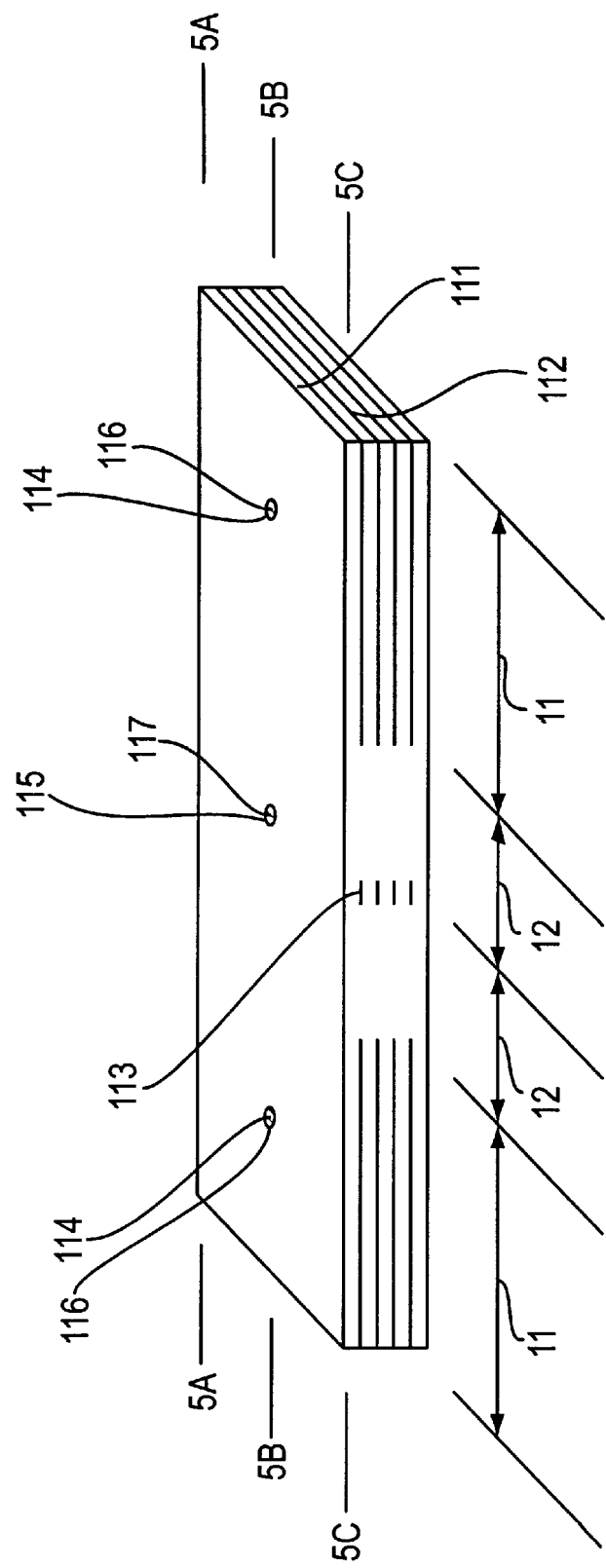
FIG. 4 is a perspective view of a laminated piezoelectric transformer according to a first embodiment of the present invention.

As shown in FIG. 4, a laminated piezoelectric transformer according to a first embodiment of the present invention comprises a pair of low-impedance drive regions 11 each comprising a plurality of piezoelectric layers 111 and inner electrodes 112 which are alternately superposed. The laminated piezoelectric transformer has openings 114 defined respectively in the drive regions 11 and filled with respective inner electrode connecting electrodes 116 for applying an input voltage to the piezoelectric transformer to energize same.

The piezoelectric transformer also has a pair of electric generators 12 disposed between the drive regions 11 and each comprising a plurality of piezoelectric layers 111 and inner electrodes 113 which are alternately superposed. The electric generators 12 have an opening 115 defined therebetween which is filled with an inner electrode connecting electrode 117 for extracting an output voltage from the piezoelectric transformer.

Figure 5A:
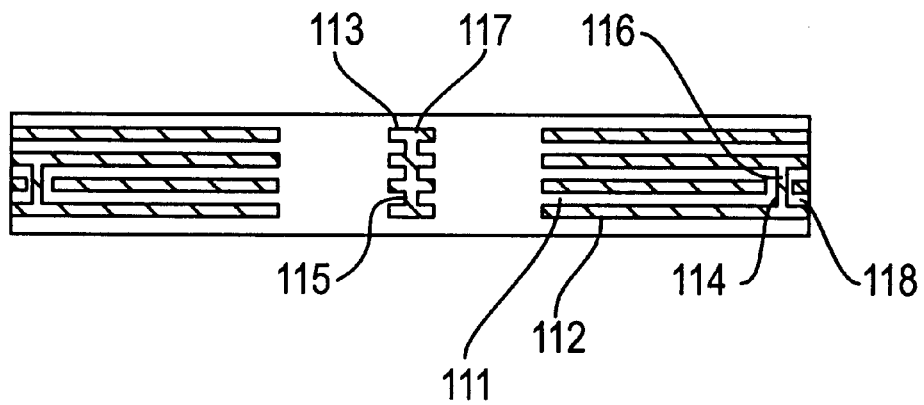
FIGS. 5A, 5B, and 5C are cross-sectional views taken along lines 5A—5A, 5B—5B, 5C—5C, respectively, of FIG. 4.
Figure 5B:
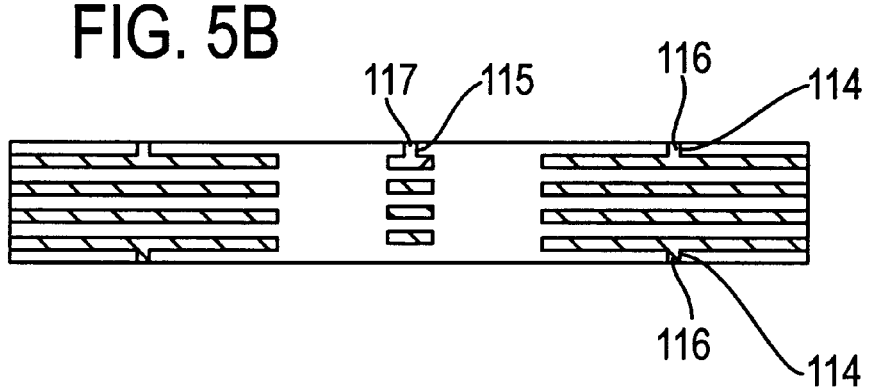
Figure 5C:
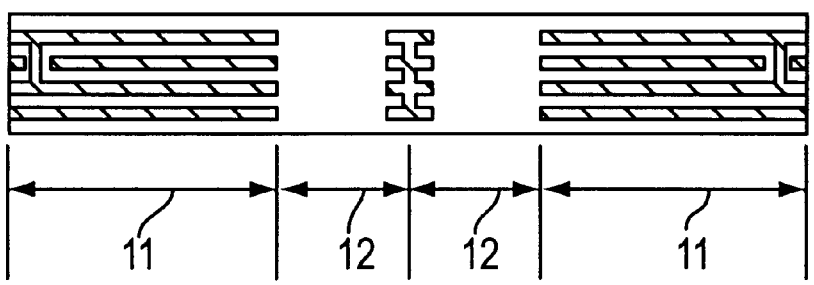

As shown in FIGS. 5A through 5C, alternate ones of the inner electrodes 112 in each of the drive regions 11 are electrically connected to each other by the inner electrode connection electrodes 116 in the opening 114 and insulated from other inner electrodes 112 by electrode-free gaps 118 in the openings 114. The piezoelectric layers 111 between the inner electrodes 112 are polarized in a direction along the thickness of the piezoelectric transformer.

As shown in FIG. 5A, all the inner electrodes 113 are electrically interconnected by the inner electrode connecting electrode 117 in the opening 115 for extracting an output voltage from the electric generators 12.

A pattern of the inner electrodes will be described below with reference to FIGS. 6A through 6E.

Figure 6A:
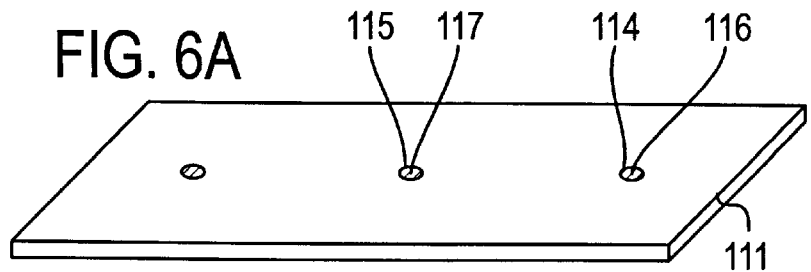
FIGS. 6A through 6E are perspective views of respective layers of the laminated piezoelectric transformer shown in FIG. 4.
Figure 6B:
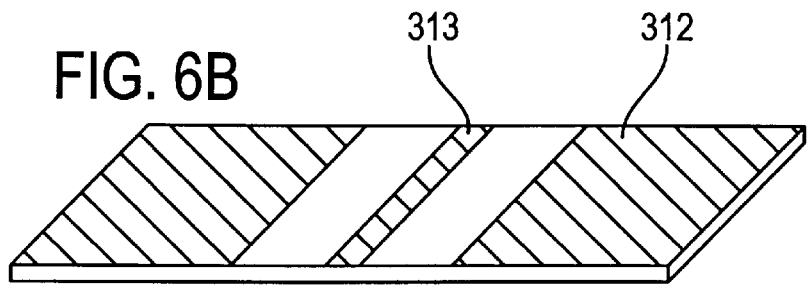
Figure 6C:
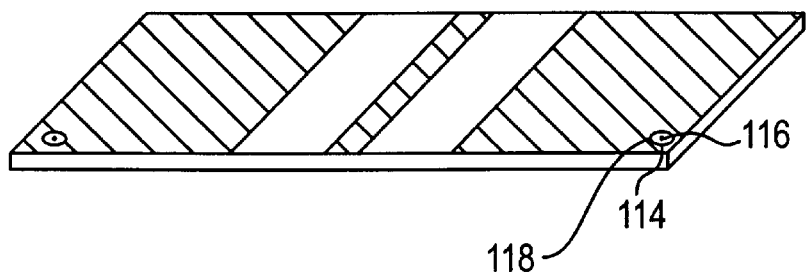
Figure 6D:
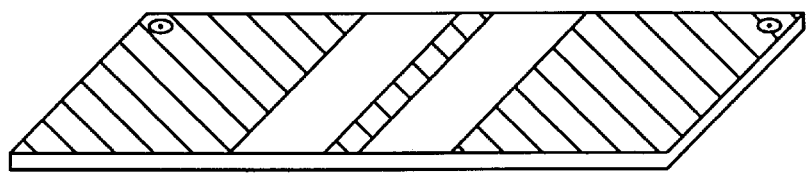
Figure 6E:
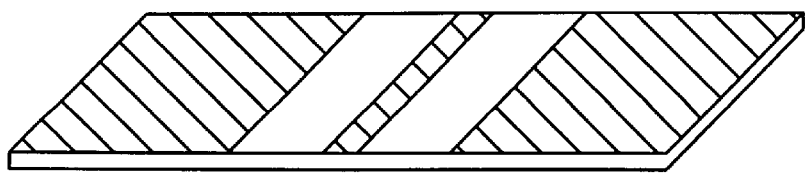
Figure 7A:
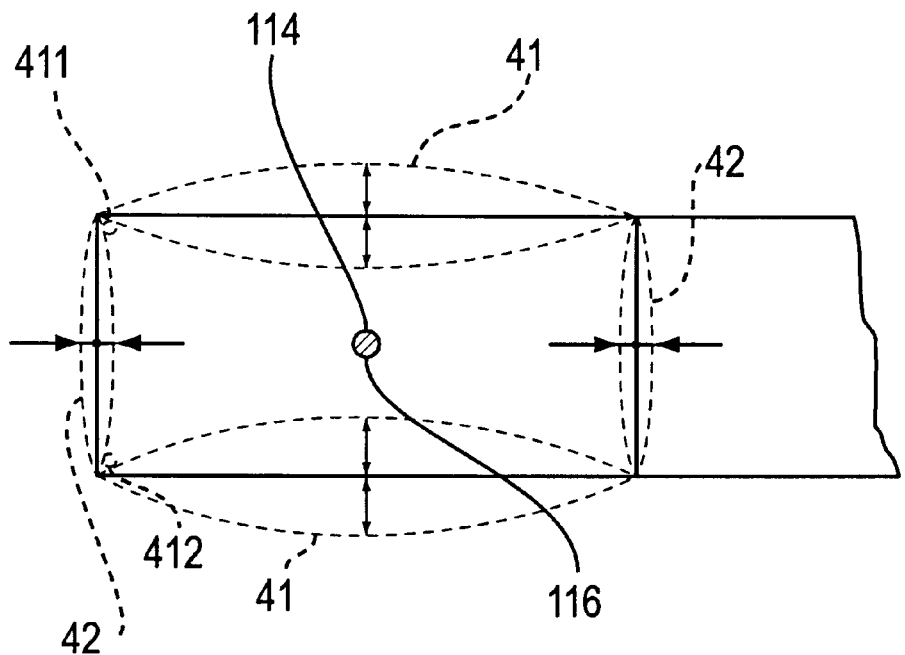
FIGS. 7A and 7B are fragmentary plan and side elevational views illustrative of the manner in which the laminated piezoelectric transformer shown in FIG. 4 is oscillatingly displaced.
Figure 7B:
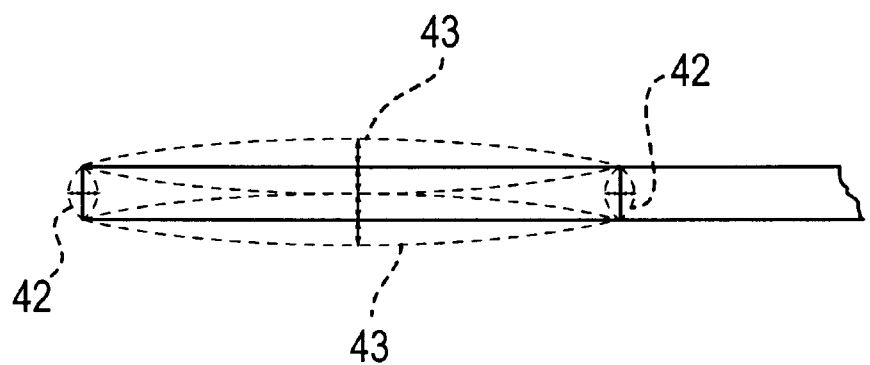

FIGS. 6A through 6E show the respective piezoelectric layers 111 of the laminated piezoelectric transformer. FIGS. 6A and 6E show outermost ones of the piezoelectric layers 111 which have the inner electrode connection electrodes 116, 117 (not shown in FIG. 6E). The piezoelectric layers 111 shown in FIGS. 6B through 6E have full-face inner electrode patterns 312 which lie as the inner electrodes 112 in the drive regions 11. The piezoelectric layers 111 shown in FIGS. 6C and 6D have the openings 114 defined in corners thereof and filled with the inner electrode connection electrodes 116 for connecting alternate ones of the inner electrodes 112. The inner electrode connection electrodes 116 are surrounded by the electrode-free gaps 118 for insulating alternate ones of the inner electrodes 112. Although not shown, the piezoelectric layers 111 have openings defined in opposite corners thereof for connecting alternate ones of the inner electrodes 112, but there are no electrode-free gaps in these openings.

As shown in FIGS. 6A through 6E, the piezoelectric layers 111 also have web-shaped inner electrode patterns 313 which lie as the inner electrodes 113 for extracting an output voltage from the electric generators 12. Although not shown, the web-shaped inner electrode patterns 313 have openings filled with inner electrode connecting electrodes for connecting the inner electrodes 113.

A process of manufacturing the laminated piezoelectric transformer will be described below.

Figure 1:
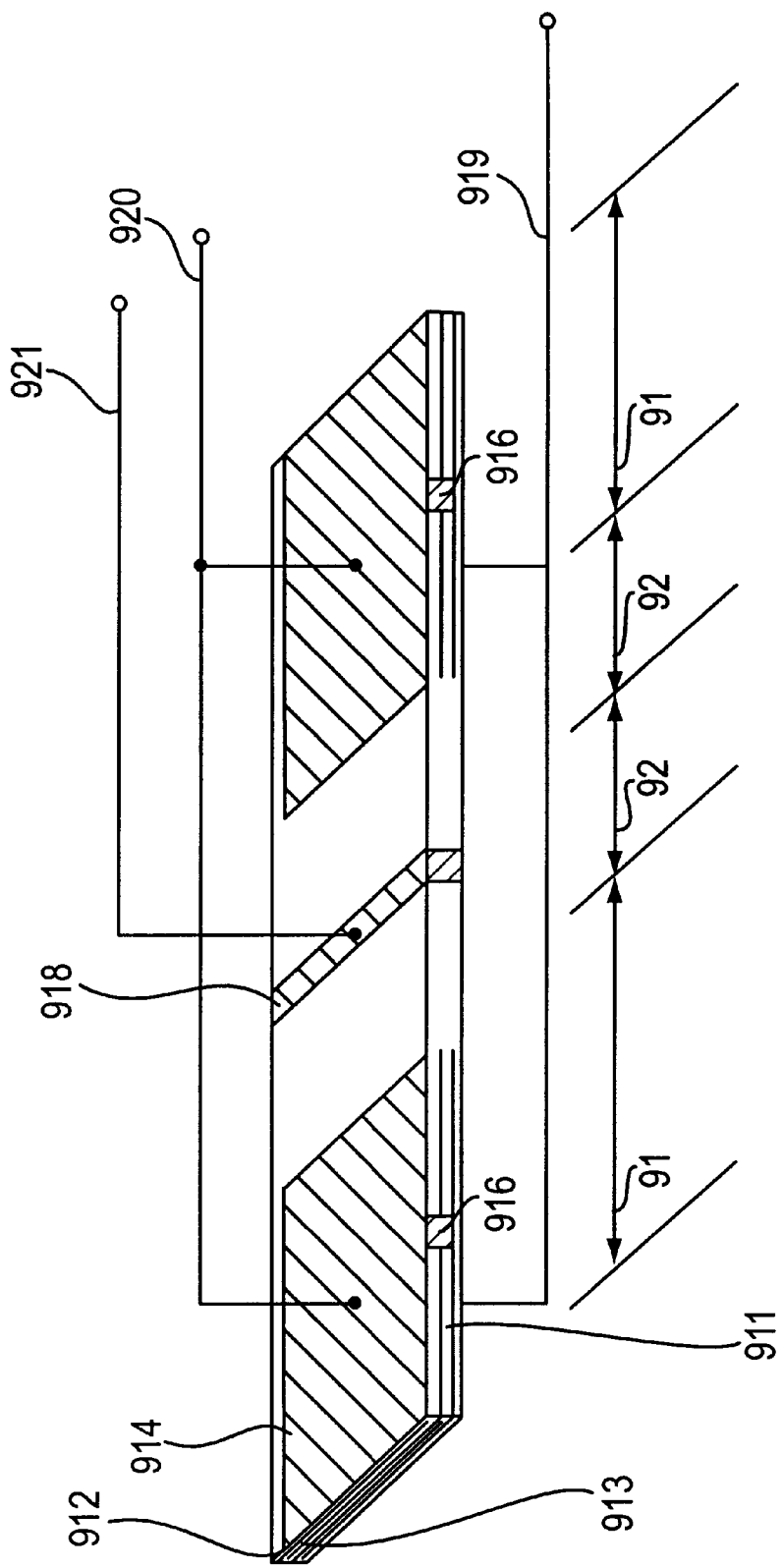
FIG. 1 is a perspective view of a conventional piezoelectric transformer.
Figure 2A:
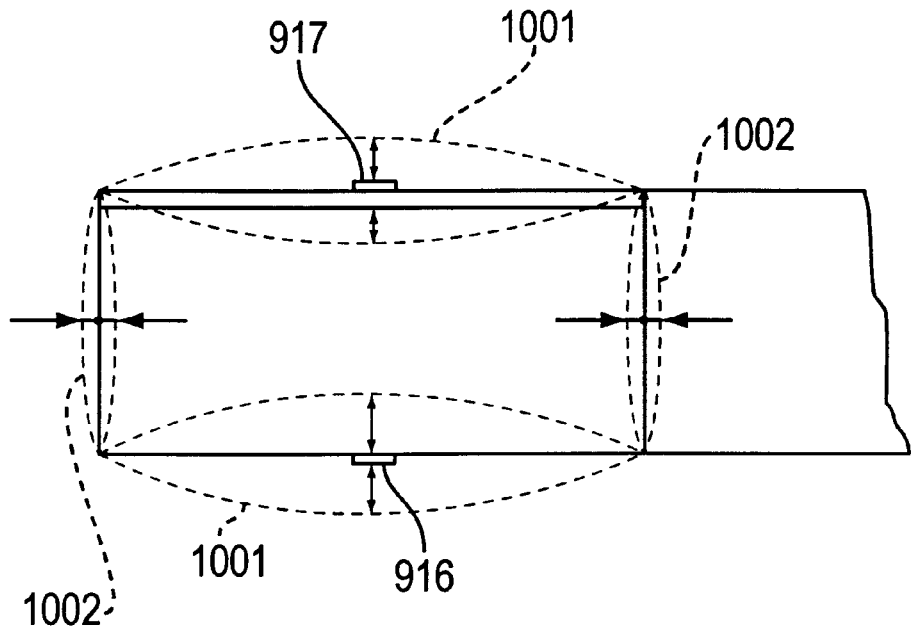
FIGS. 2A and 2B are fragmentary plan and side elevational views illustrative of the manner in which the conventional piezoelectric transformer is oscillatingly displaced.
Figure 2B:
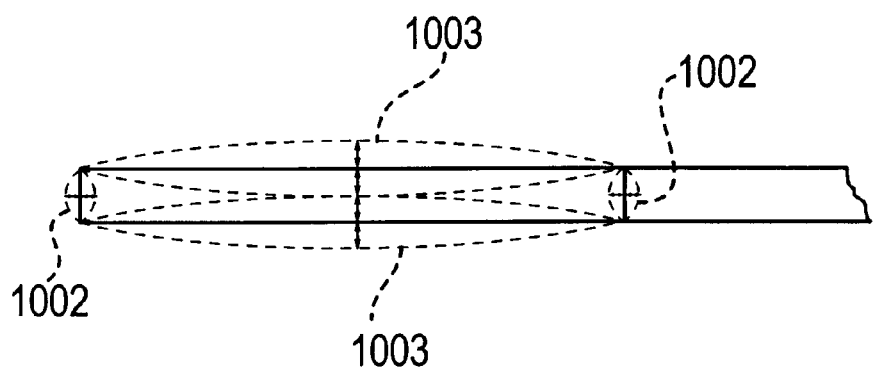
Figure 3A:
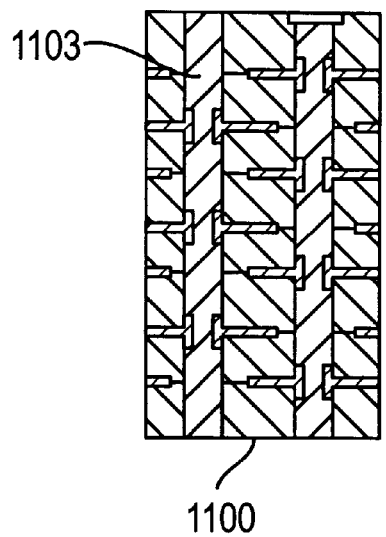
FIG. 3A is a cross-sectional view of a conventional laminated piezoelectric actuator with openings defined therein.
Figure 3B:
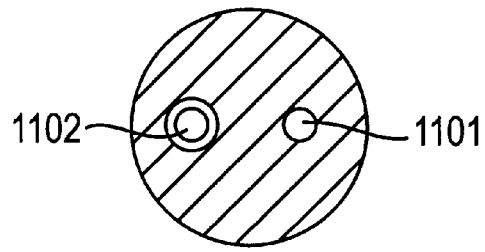
FIGS. 3B and 3C are plan and bottom views of the conventional laminated piezoelectric actuator shown in FIG. 3A.
Figure 3C:
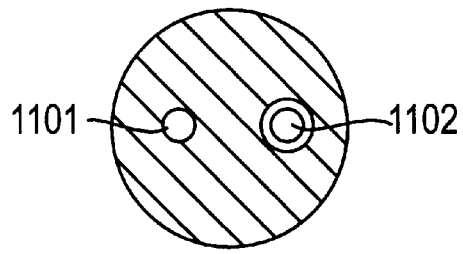

The laminated piezoelectric transformer shown in FIG. 1 is fabricated from green sheets. Specifically, the piezoelectric layers 111 are made of Nepec 8 (manufactured by Tokin Corp.).

After green sheets are prepared for use as the piezoelectric layers 111, openings 114, 115 each having a diameter of 0.5 mm are formed in the green sheets at predetermined positions by a jig having piercing pins.

Then, using a sinterable electrically conductive paste of Ag/Pd, the inner electrodes 112 in the drive regions 11 and the inner electrodes 113 in the electric generators 12 are printed according to the inner electrode patterns 312, 313 on the green sheets, and the openings 114, 115 are filled with the conductive paste.

The green sheets with the inner electrodes 112, 113 printed thereon are stacked and pressed, and then sintered together at a temperature of 1100° C. for 2 hours, thereby producing a laminated piezoelectric transformer.

In the above embodiment, the piezoelectric layers 111 are made of PZT piezoelectric ceramics, and the inner electrodes 112, 113 are made of Ag/Pd. However, the piezoelectric layers 111 and the inner electrodes 112, 113 may be made of any combination of other piezoelectric and electrode materials provided they can be sintered together.

The layers of the laminated piezoelectric transformer thus manufactured include three inner active piezoelectric layers, two outermost inactive piezoelectric layers, and four inner electrode layers. Each of the piezoelectric layers has a thickness of 200 μm, and the laminated piezoelectric transformer has an overall thickness of 1 mm.

Thereafter, using a polarization jig, an electric field ranging from 0.5 to 0.7 kV/mm is applied to the laminated piezoelectric transformer in air at a temperature ranging from 300 to 350° C., and while the electric field is being applied, the temperature is lowered to 100° C., after which the applied electric field is turned off, thus polarizing the electric generators 11.

Then, an electric field ranging from 2 to 3 kV/mm is applied to the laminated piezoelectric transformer in silicone oil at a temperature ranging from 100 to 200° C., thus polarizing the drive regions 12.

The laminated piezoelectric transformer was evaluated for its characteristics by applying a voltage thereto with a resistance of 100 kΩ connected as a load. The laminated piezoelectric transformer had a transformation efficiency of 98% while the conventional laminated piezoelectric transformer had a transformation efficiency of 93%, and had a boosting ratio of 48 while the conventional laminated piezoelectric transformer had a boosting ratio of 44. Even when the laminated piezoelectric transformer was repeatedly energized, it developed no cracking, and hence was sufficiently reliable.

In the above evaluation test, the laminated piezoelectric transformer had the inner electrodes 112, 113 on the output side. However, a laminated piezoelectric transformer having no inner electrodes 112, 113 produced the same results in an evaluation test.

In the above embodiment, the laminated piezoelectric transformer has the openings 114, 115 defined in the opposite surfaces of thereof. However, the openings 114, 115 may be defined in one of the opposite surfaces of the laminated piezoelectric transformer.

Figure 8:
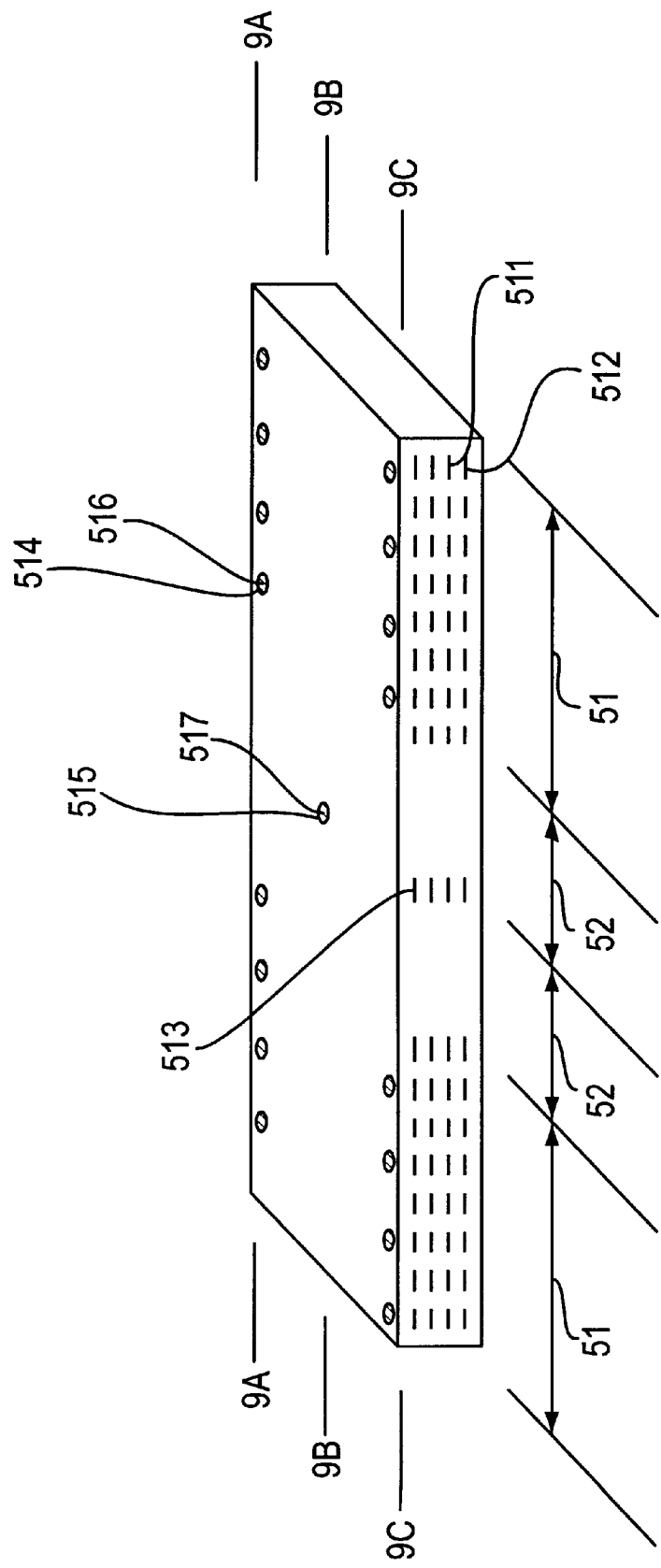
FIG. 8 is a perspective view of a laminated piezoelectric transformer according to a second embodiment of the present invention.

FIG. 8 shows a laminated piezoelectric transformer according to a second embodiment of the present invention. The laminated piezoelectric transformer according to the second embodiment differs from the laminated piezoelectric transformer according to the first embodiment with respect to inner electrode patterns in drive regions, the manner in which the inner electrode patterns are connected, and the direction in which the drive regions are polarized.

As shown in FIG. 8, the laminated piezoelectric transformer according to the second embodiment comprises a pair of low-impedance drive regions 51 each comprising a plurality of piezoelectric layers 511 and inner electrodes 512 which are alternately superposed. The laminated piezoelectric transformer has openings 514 defined respectively in the drive regions 51 at opposite edges on one surface thereof and filled with respective inner electrode connecting electrodes 516 for applying an input voltage to the piezoelectric transformer to energize same.

The piezoelectric transformer also has a pair of electric generators 52 disposed between the drive regions 51 and each comprising a plurality of piezoelectric layers 511 and inner electrodes 513 which are alternately superposed. The electric generators 52 have an opening 515 defined therebetween which is filled with an inner electrode connecting electrode 517 for extracting an output voltage from the piezoelectric transformer.

Figure 9A:
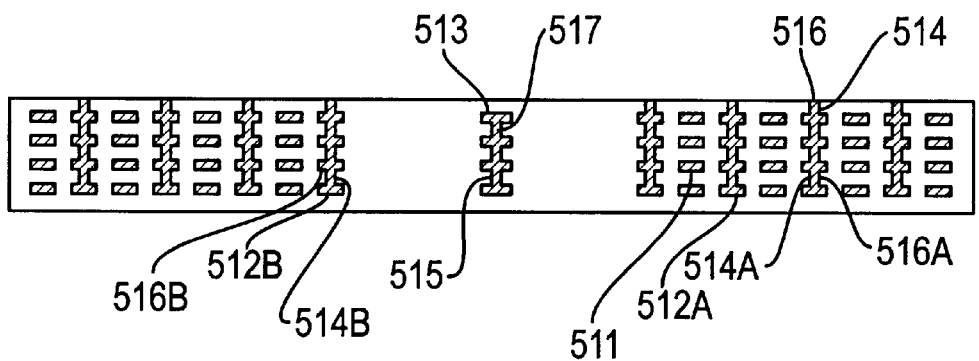
FIGS. 9A through 9C are cross-sectional views taken along lines 9A—9A, 9B—9B, 9C—9C, respectively, of FIG. 8.
Figure 9B:
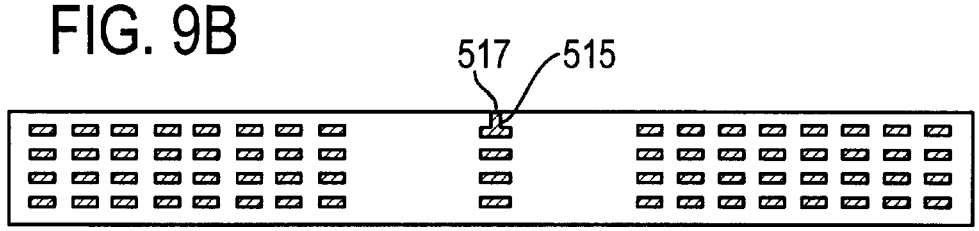
Figure 9C:
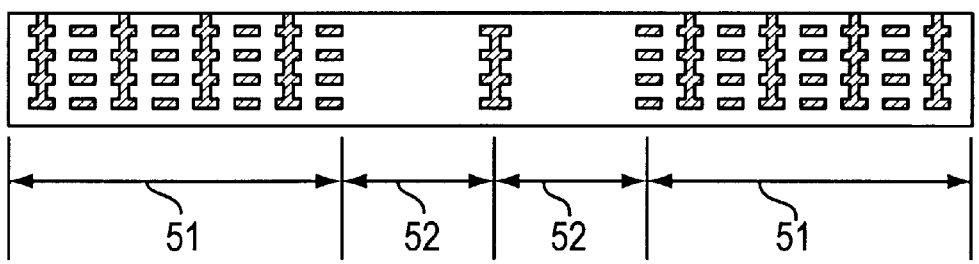

As shown in FIGS. 9A through 9C, the inner electrodes, denoted by 512A, 512B, in each of the drive regions 51 are electrically connected to each other by the inner electrode connection electrodes, denoted by 516A, 516B, filled in the openings, denoted by 514A, 514B. The piezoelectric layers 511 between the inner electrodes 512A, 512B are polarized in a direction along the thickness of the piezoelectric transformer.

As shown in FIG. 9A, all the inner electrodes 513 are electrically interconnected by the inner electrode connecting electrode 517 in the opening 515 for extracting an output voltage from the electric generators 52.

A pattern of the inner electrodes will be described below with reference to FIGS. 10A through 10C.

Figure 10A:
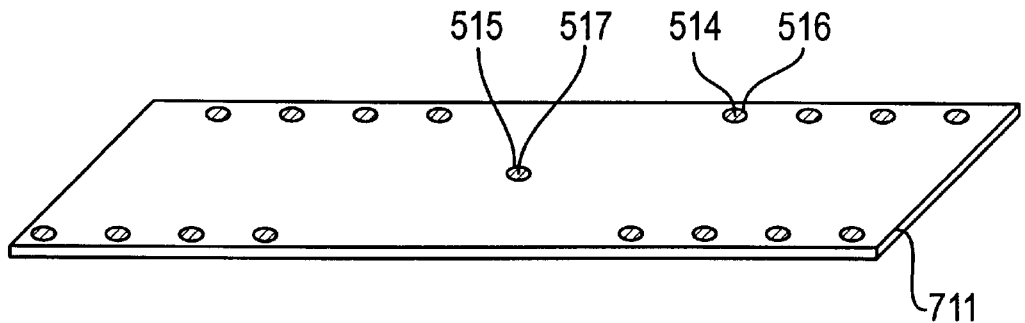
FIGS. 10A, 10B, and 10C are perspective views of respective layers of the laminated piezoelectric transformer shown in FIG. 8.
Figure 10B:
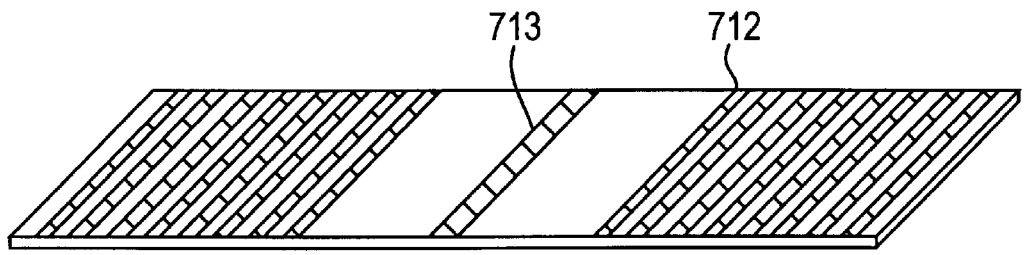
Figure 10C:
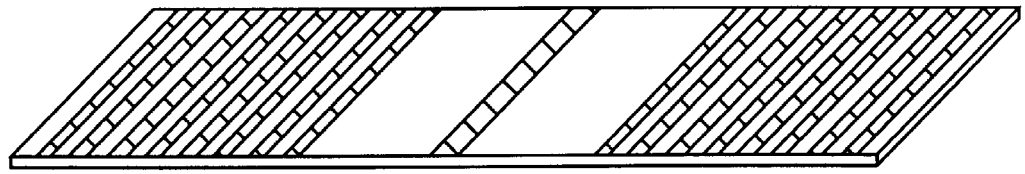
Figure 11A:
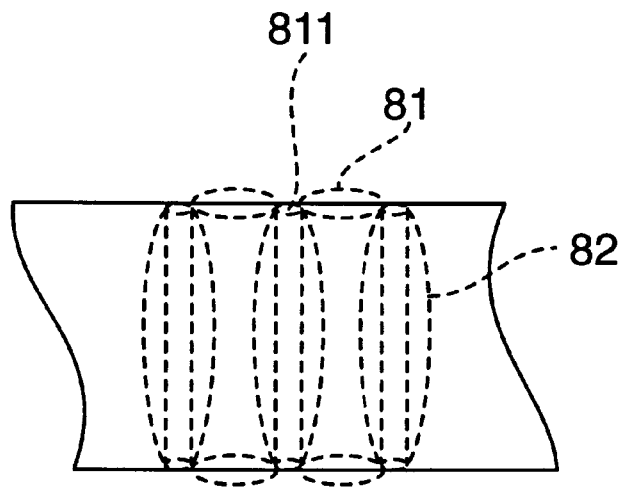
FIGS. 11A and 11B are fragmentary elevational views illustrative of the manner in which the laminated piezoelectric transformer shown in FIG. 8 is oscillatingly displaced.
Figure 11B:
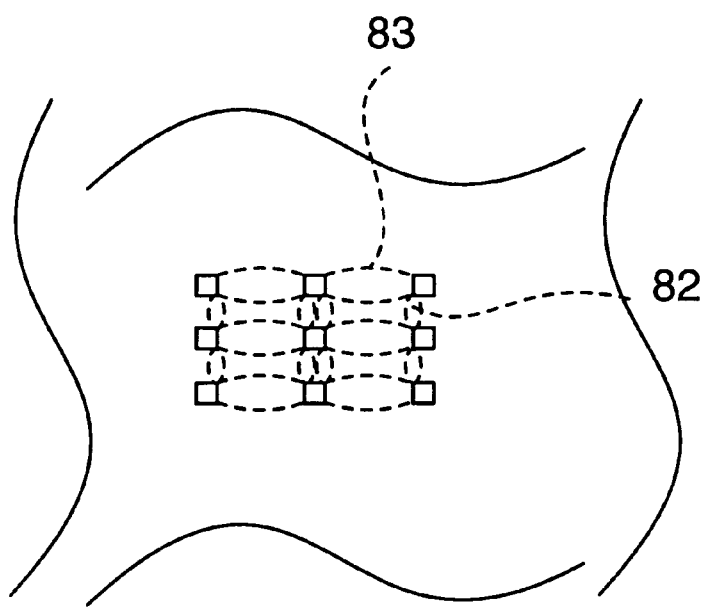

FIGS. 10A through 10C show the respective piezoelectric layers 711 of the laminated piezoelectric transformer. FIGS. 10A and 10C show outermost ones of the piezoelectric layers 711 which have the inner electrode connection electrodes 516, 517 (not shown in FIG. 10C) in the drive regions 51 and the electric generators 52.

The piezoelectric layers 711 shown in FIGS. 10B and 10C have web-shaped inner electrode patterns 712 which lie as the inner electrodes 512 in the drive regions 51. The inner electrodes 512 are electrically connected by the inner electrode connection electrodes 516 filled in the openings 514 at the ends of the inner electrodes 512.

As shown in FIGS. 10B and 10C, the piezoelectric layers 711 also have web-shaped inner electrode patterns 713 which lie as the inner electrodes 513 for extracting an output voltage from the electric generators 52. Although not shown, the web-shaped inner electrode patterns 713 have openings defined at ends thereof and filled with-inner electrode connecting electrodes for connecting the inner electrodes 513.

Using a polarization jig, an electric field ranging from 1.5 to 2 kV/mm is applied to the laminated piezoelectric transformer in silicone oil at a temperature ranging from 100 to 200° C., thereby polarizing the piezoelectric layers between the web-shaped inner electrode patterns 712 in the longitudinal direction.

In the laminated piezoelectric transformer according to the second embodiment, adjacent ones of the web-shaped inner electrode patterns 712 are spaced from each other by 0.5 mm, and eight web-shaped inner electrode patterns 712 are provided on each of the piezoelectric layers 711 in each of the drive regions 51. The layers of the laminated piezoelectric transformer according to the second embodiment include three inner active piezoelectric layers, two outermost inactive piezoelectric layers, and four inner electrode layers. Each of the piezoelectric layers has a thickness of 200 μm, and the laminated piezoelectric transformer has an overall thickness of 1 mm.

The laminated piezoelectric transformer according to the second embodiment was evaluated for its characteristics by applying a voltage thereto with a resistance of 100 kΩ connected as a load. The laminated piezoelectric transformer had a transformation efficiency of 96% while the conventional laminated piezoelectric transformer had a transformation efficiency of 93%, and had a boosting ratio of 70 while the conventional laminated piezoelectric transformer had a boosting ratio of 44. The laminated piezoelectric transformer according to the second embodiment has its transformation efficiency slightly lower than the laminated piezoelectric transformer according to the first embodiment, but has its boosting ratio about 1.5 times the laminated piezoelectric transformer according to the first embodiment. Therefore, the laminated piezoelectric transformer according to the second embodiment is more useful in applications where higher output voltages are desirable.

Reasons why the boosting ratio of the laminated piezoelectric transformer according to the second embodiment is higher than the boosting ratio of the laminated piezoelectric transformer according to the first embodiment will be described below.

In each of the drive regions 11 of the laminated piezoelectric transformer according to the first embodiment, the piezoelectric layers 111 are polarized in a direction along the thickness of the piezoelectric transformer. When energized, the laminated piezoelectric transformer according to the first embodiment effects an electromechanical conversion process in the polarized direction. Specifically, the laminated piezoelectric transformer according to the first embodiment generates a voltage based on an electromechanical coupling coefficient of k31 for laterally extracting a displacement in the direction along the thickness.

In each of the drive regions 51 of the laminated piezoelectric transformer according to the second embodiment, the piezoelectric layers 511 are polarized in a direction along the length of the piezoelectric transformer. When energized, the laminated piezoelectric transformer according to the second embodiment effects an electromechanical conversion process in the polarized direction. Specifically, the laminated piezoelectric transformer according to the second embodiment generates a voltage based on an electromechanical coupling coefficient of k33 for longitudinally extracting a displacement in the direction along the length.

The electromechanical coupling coefficient of k33 as a material constant is about twice the electromechanical coupling coefficient of k31 as a material constant. Thus, a higher voltage can be generated by using the electromechanical coupling coefficient of k33. The boosting ratio of the laminated piezoelectric transformer according to the second embodiment is about 1.5 times, not about twice (according to the ratio of material constants), the boosting ratio of the laminated piezoelectric transformer according to the first embodiment because it is affected by the configuration of the transformer.

In the above evaluation test, the laminated piezoelectric transformer according to the second embodiment had the inner electrodes on the output side. However, a laminated piezoelectric transformer having no inner electrodes produced the same results in an evaluation test.

In the second embodiment, the laminated piezoelectric transformer has the openings 514 defined respectively in the drive regions 51 at opposite edges on one surface thereof. However, the openings 514 may be defined at one of the opposite edges or in opposite surfaces of the drive regions 51.

While preferred embodiments of the present invention have been described using specific terms, such description is for illustrative purposes only, and it is to be understood that changes and variations may be made without departing from the spirit or scope of the following claims.

What is claimed is:

1. A method of manufacturing a laminated piezolectric transformer comprising an elongate piezoelectric transformer body including a pair or drive regions disposed at respective opposite ends thereof and each comprising a plurality of longitudinally polarized piezoelectric layers and inner electrodes which are alternately superposed, and a longitudinally polarized electric generator disposed longitudinally centrally between said drive regions, said piezoelectric layers in the drive regions including outermost ceramic layers having first openings defined therein for connection to inner electrodes, said inner electrodes in the drive regions comprising full-face electrodes, each of said inner electrodes in the drive regions having a second opening defined in a corner thereof and filled with an electrically conductive electrode and a third opening defined and filled with an electrically conductive electrode and a third opening surrounded by an electrode-free gap, said piezoelectric layers in the drive regions being stacked such that the inner electrodes thereof are alternately electrically interconnected through said second and third openings which are alternately superposed one on another, said electric generator comprising piezoelectric layers and web-shaped inner electrodes, each of said web-shaped inner electrodes having a fourth opening defined in at least one end thereof and filled with an electrically conductive electrode, said piezoelectric layers of said electric generator being stacked such that the inner electrodes thereof are electrically interconnected through said fourth openings which are superposed one on another, said method comprising the steps of:

defining the first, second, third and fourth openings in the piezoelectric layers at predetermined positions thereon;

selectively filling the first, second, third and fourth openings with the electrically conductive electrodes and forming inner electrode patterns on the piezoelectric layer;

stacking said piezoelectric layers such that the first, second, third and fourth openings are selectively superposed; and simultaneously sintering said piezoelectric layers, said inner electrode patterns, and said electrically conductive electrodes.

2. A method of manufacturing a laminated piezoelectric transformer comprising an elongate piezoelectric transformer body including a pair of drive regions disposed at respective opposite ends thereof and each comprising a plurality of longitudinally polarized piezoelectric layers and inner electrodes which are alternately superposed, and a longitudinally polarized electric generator disposed longitudinally centrally between said drive regions, said piezoelectric layers in the drive regions including outermost ceramic layers having first openings defined therein for connection to inner electrodes, said inner electrodes in the drive regions comprising at least two web-shaped electrodes each of said web-shaped electrodes having a second opening defined in at least one end thereof and filled with an electrically conductive electrode, said piezoelectric layer in the drive regions being stacked such that the inner electrodes thereof are electrically interconnected through said second openings which are alternately superposed one on another, said electric generator comprising piezoelectric layers and web-shaped inner electrodes, each of said web-shaped inner electrodes having a third opening defined in at least one end thereof and filled with an electrically conductive electrode, said piezoelectric layers of said electric generator being stacked such that the inner electrodes thereof are electrically interconnected through said third openings which are superposed one on another, said method comprising the steps of:

defining the first, second and third openings in the piezoelectric layers at predetermined positions thereon;

selectively filling the first, second and third openings with the electrically conductive electrodes and forming inner electrode patterns on the piezoelectric layer;

stacking said piezoelectric layers such that the first, second and third openings are selectively superposed; and simultaneously sintering said piezoelectric layers, said inner electrode patterns, and said electrically conductive electrodes.

* * * * *